(12) United States Patent
Choi et al.

(10) Patent No.: US 9,728,594 B2
(45) Date of Patent: Aug. 8, 2017

(54) DISPLAY DEVICE

(71) Applicant: Samsung Display Co., Ltd., Yongin-si, Gyeonggi-Do (KR)

(72) Inventors: Jaebeom Choi, Yongin-si (KR); Yunmo Chung, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/838,224

(22) Filed: Aug. 27, 2015

(65) Prior Publication Data

US 2016/0181342 A1 Jun. 23, 2016

(30) Foreign Application Priority Data

Dec. 19, 2014 (KR) .......................... 10-2014-0184962

(51) Int. Cl.
| | | |
|---|---|---|
| *H01L 27/15* | (2006.01) | |
| *H01L 27/32* | (2006.01) | |
| *H01L 51/52* | (2006.01) | |
| *H01L 31/0203* | (2014.01) | |
| *H01L 31/0232* | (2014.01) | |

(52) U.S. Cl.
CPC ...... *H01L 27/3269* (2013.01); *H01L 27/3227* (2013.01); *H01L 31/0203* (2013.01); *H01L 31/02327* (2013.01); *H01L 51/5246* (2013.01); *H01L 51/5256* (2013.01); *H01L 51/5271* (2013.01); *H01L 51/5275* (2013.01); *H01L 2251/558* (2013.01)

(58) Field of Classification Search
CPC ........... H01L 2251/558; H01L 27/3227; H01L 27/3269; H01L 31/0203; H01L 31/02327; H01L 51/5246; H01L 51/5256; H01L 51/5271; H01L 51/5275
USPC .................. 257/81, 80, 40; 362/615; 1/1
See application file for complete search history.

(56) References Cited

U.S. PATENT DOCUMENTS

| | | | |
|---|---|---|---|
| 9,052,770 B2 * | 6/2015 | Hong ............... | G06F 3/0414 |
| 9,582,131 B2 * | 2/2017 | Elias ................ | G06F 3/044 |
| 2003/0197197 A1 | 10/2003 | Brown et al. | |
| 2007/0153548 A1 * | 7/2007 | Hamada ........... | G02B 6/0036 362/615 |
| 2010/0052521 A1 | 3/2010 | Kim et al. | |

(Continued)

FOREIGN PATENT DOCUMENTS

| KR | 10-2010-0020666 A | 2/2010 |
|---|---|---|
| KR | 10-2010-0024710 A | 3/2010 |

(Continued)

OTHER PUBLICATIONS

Extended European Search Report dated May 30, 2016 for European Patent Application No. EP 15 200 430.5 which shares priority of Korean Patent Application No. KR 10-2014-0184962 with subject U.S. Application No. 14/838,224.

*Primary Examiner* — Mohammed Shamsuzzaman
(74) *Attorney, Agent, or Firm* — Knobbe Martens Olson & Bear LLP

(57) ABSTRACT

A display device is disclosed. In one aspect, the display device includes a substrate, a display unit formed over the substrate and a thin film encapsulation layer covering the display unit. The display device further includes an encapsulation substrate formed over the thin film encapsulation layer and encapsulating the display unit and a photosensor formed on an end of the thin film encapsulation layer.

13 Claims, 5 Drawing Sheets

(56) References Cited

U.S. PATENT DOCUMENTS

| | | | |
|---|---|---|---|
| 2010/0090998 A1* | 4/2010 | Kim | G09G 3/3233 345/207 |
| 2012/0086673 A1* | 4/2012 | Chien | G06F 3/0428 345/175 |
| 2013/0342518 A1* | 12/2013 | Nakata | H04N 5/2351 345/207 |
| 2014/0009960 A1 | 1/2014 | Miyamoto et al. | |
| 2014/0021856 A1* | 1/2014 | Jung | H01L 51/5253 313/504 |
| 2014/0103216 A1* | 4/2014 | Sasaki | G01T 1/20 250/361 R |
| 2014/0111711 A1* | 4/2014 | Iwami | B32B 7/02 349/12 |
| 2014/0145150 A1* | 5/2014 | de Jong | H01L 27/3227 257/40 |
| 2015/0311260 A1* | 10/2015 | Senda | H01L 51/5253 257/40 |
| 2016/0093251 A1* | 3/2016 | Chung | G01J 1/0403 345/207 |
| 2016/0163747 A1* | 6/2016 | Koide | H01L 27/1443 257/80 |

FOREIGN PATENT DOCUMENTS

| | | |
|---|---|---|
| KR | 10-2013-0009520 A | 1/2013 |
| KR | 10-2013-0117112 A | 10/2013 |
| WO | WO 2004/023443 A2 | 3/2004 |

\* cited by examiner

DISPLAY DEVICE

RELATED APPLICATION

This application claims priority to and the benefit of Korean Patent Application No. 10-2014-0184962, filed on Dec. 19, 2014, in the Korean Intellectual Property Office, the disclosure of which is incorporated herein in its entirety by reference.

BACKGROUND

Field

The described technology generally relates to a display device.

Description of the Related Technology

Along with the development of information technology, the market for display devices, which are media for connecting users with information, has expanded. Accordingly, display devices, such as liquid crystal displays (LCDs), organic light-emitting diode (OLED) displays, electrophoretic displays (EPDs), and plasma display panels (PDPs), are widely used.

Among the above-described display devices, LCDs, OLED displays, and EPDs are being developed into flexible display devices, and some of them have been implemented as cubic image display devices.

With the rapid development of semiconductor technology, display panels using OLEDs from among various display panels which are used in display devices have attracted much attention of late.

In OLED displays, pixels, each of which is a basic unit of image expression, are arranged on a substrate in a matrix form, and a thin film transistor (TFT) is included in each pixel to independently control the pixel.

Such OLED displays may be classified into top-emission type display devices and bottom-emission type display devices according to the direction in which light is emitted.

SUMMARY OF CERTAIN INVENTIVE ASPECTS

One inventive aspect relates to a display device.

Another aspect is a display device that includes a substrate; a display unit formed on the substrate; a thin film encapsulation formed on an upper surface of the substrate to cover the display unit; an encapsulation substrate formed on an upper surface of the thin film encapsulation to encapsulate the display unit; and a photosensor on one end of the thin film encapsulation.

The thin film encapsulation may include a plurality of organic layers and a plurality of inorganic layers which are alternately stacked.

The plurality of organic layers and the plurality of inorganic layers may have different refractive indices from each other.

A total reflection of light may repeatedly occur within the thin film encapsulation and the reflected light travels sideways.

The display device may further include an adhesion layer between the thin film encapsulation and the encapsulation substrate, the adhesion layer attaching the thin film encapsulation to the encapsulation substrate.

The adhesion layer may include a transparent organic material.

The adhesion layer may include metal particles.

A reflection layer may be formed on an upper surface of the adhesion layer.

Another aspect is a display device that includes a substrate having a light-emitting region and an outer region; an encapsulation substrate formed opposite the substrate; a display unit formed in the light-emitting region of the substrate; a thin film encapsulation formed on an upper surface of the substrate to cover the display unit; and a photosensor in the outer region of the substrate.

The thin film encapsulation may include a plurality of organic layers and a plurality of inorganic layers which are alternately stacked.

The plurality of organic layers and the plurality of inorganic layers may have different refractive indices from each other.

A total reflection of light may repeatedly occur within the thin film encapsulation and the reflected light travels sideways.

The photosensor may be formed on a lateral surface of the thin film encapsulation.

The display device may further include an adhesion layer between the thin film encapsulation and the encapsulation substrate, the adhesion layer attaching the thin film encapsulation to the encapsulation substrate.

The adhesion layer may include a transparent organic material.

The adhesion layer may include metal particles.

A reflection layer may be formed on an upper surface of the adhesion layer.

Another aspect is a display device comprising: a substrate; a display unit formed over the substrate; a thin film encapsulation layer covering the display unit; an encapsulation substrate formed over the thin film encapsulation layer and encapsulating the display unit; and a photosensor formed on an end of the thin film encapsulation layer.

In the above display device, the thin film encapsulation layer comprises a plurality of organic layers and a plurality of inorganic layers which are alternately stacked. In the above display device, the organic layers and the inorganic layers have different refractive indices from each other. In the above display device, when a total reflection of light repeatedly occurs within the thin film encapsulation layer, the reflected light is configured to travel sideways. The above display device further comprises an adhesion layer formed between the thin film encapsulation layer and the encapsulation substrate, wherein the adhesion layer attaches the thin film encapsulation layer to the encapsulation substrate. In the above display device, the adhesion layer is formed of a transparent organic material.

In the above display device, the adhesion layer comprises a plurality of metal particles. The above display device further comprises a reflection layer formed over an upper surface of the adhesion layer. The above display device, the thickness of the photosensor is substantially the same as the combined thickness of the thin film encapsulation layer, the adhesion layer and the encapsulation substrate. In the above display device, the photosensor contacts lateral surfaces of the thin film encapsulation layer, the adhesion layer and the encapsulation substrate.

Another aspect is a display device comprising: a substrate including a light-emitting region and an outer region; an encapsulation substrate formed opposite the substrate; a display unit formed in the light-emitting region of the substrate; a thin film encapsulation layer covering the display unit; and a photosensor formed in the outer region of the substrate.

In the above display device, the thin film encapsulation layer comprises a plurality of organic layers and a plurality of inorganic layers which are alternately stacked. In the above display device, the organic layers and the inorganic layers have different refractive indices from each other. In the above display device, the photosensor is formed on a lateral surface of the thin film encapsulation layer. The above display device further comprises an adhesion layer formed between the thin film encapsulation layer and the encapsulation substrate, wherein the adhesion layer attaches the thin film encapsulation layer to the encapsulation substrate. In the above display device, the thickness of the photosensor is substantially the same as the combined thickness of the thin film encapsulation layer, the adhesion layer and the encapsulation substrate. In the above display device, the photosensor contacts lateral surfaces of the thin film encapsulation layer, the adhesion layer and the encapsulation substrate.

Another aspect is a display device comprising: a substrate; a display unit formed over the substrate and configured to output light; a thin film encapsulation layer covering the display unit; and a photosensor contacting a lateral surface of the thin film encapsulation layer and configured to sense at least part of the light output from the display unit.

The above display device further comprises an encapsulation substrate formed over the thin film encapsulation layer and encapsulating the display unit, wherein the photosensor contacts a lateral surface of the encapsulation substrate. In the above display device, the thickness of the photosensor is greater than the combined thickness of the thin film encapsulation layer and the encapsulation substrate.

DETAILED DESCRIPTION OF CERTAIN INVENTIVE EMBODIMENTS

Figure 1:
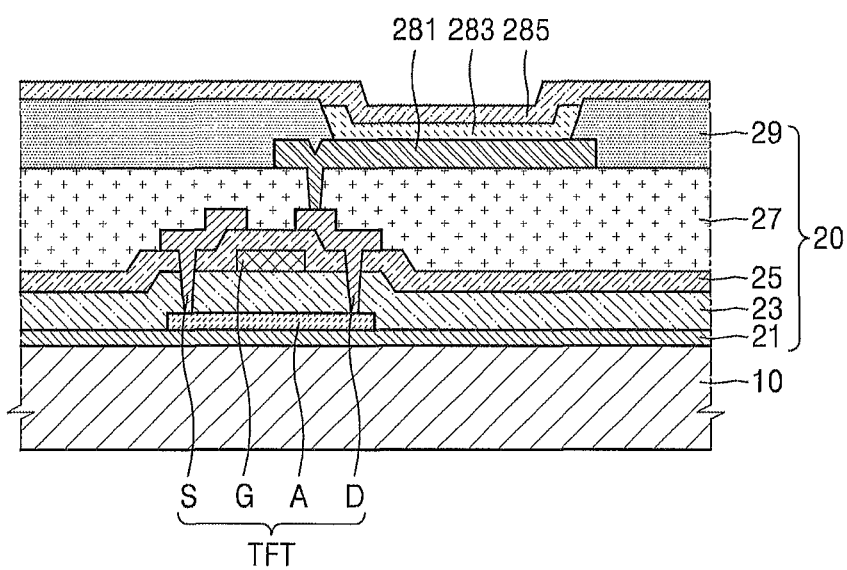
FIG. 1 is a cross-sectional view illustrating a display unit according to an embodiment.

As the described technology allows for various changes and numerous embodiments, particular embodiments will be illustrated in the drawings and described in detail in the written description. Hereinafter, effects and features of the described technology and a method for accomplishing them will be described more fully with reference to the accompanying drawings, in which exemplary embodiments are shown. This invention may, however, be embodied in many different forms and should not be construed as limited to the exemplary embodiments set forth herein.

One or more embodiments will be described below in more detail with reference to the accompanying drawings. Those components that are the same or are in correspondence are rendered the same reference numeral regardless of the figure number, and redundant explanations are omitted.

It will be understood that although the terms "the first", "the second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of" when preceding a list of elements, modify the entire list of elements and do not modify the individual elements of the list. In this disclosure, the term "substantially" includes the meanings of completely, almost completely or to any significant degree under some applications and in accordance with those skilled in the art. The term "connected" can include an electrical connection.

Figure 2:
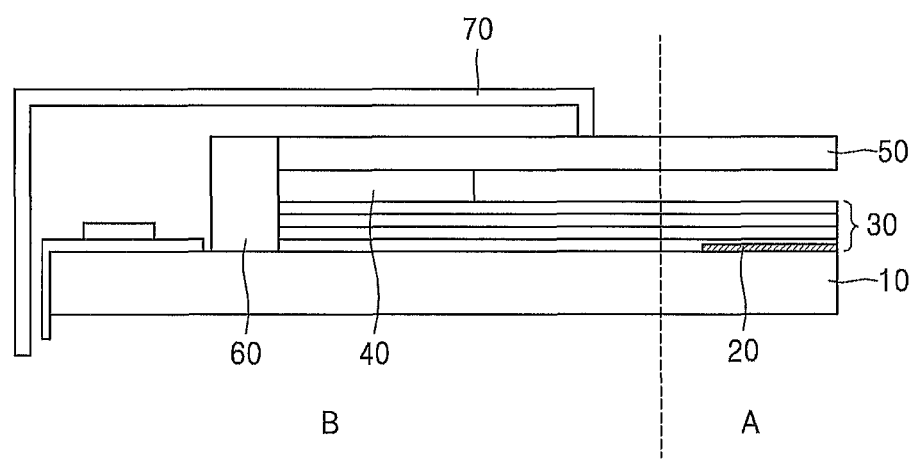
FIG. 2 is a cross-sectional view illustrating a display device including the display unit of FIG. 1 according to an embodiment.

FIG. 1 is a cross-sectional view of a display unit 20 according to an embodiment, and FIG. 2 is a cross-sectional view of a display device including the display unit of FIG. 1 according to an embodiment.

As illustrated in FIG. 2, the display device according to the present embodiment includes a substrate 10, the display unit 20, a thin film encapsulation layer 30, an encapsulation substrate 50, and a photosensor 60.

The substrate 10 can be formed of a transparent glass material containing $SiO_2$ as a main component. However, the material used to form the substrate 10 is not limited thereto, and the substrate 10 can be formed of a transparent plastic material.

In the display unit 20 formed on the substrate 10, an array of pixels may be formed. Each of the pixels may include a thin film transistor and a light-emitting device that is controlled by the thin film transistor. The light-emitting device may be an organic light-emitting device, which is a self-emission type device.

Only a case where the display unit 20 includes organic light-emitting devices will now be described for convenience of explanation.

The display unit 20 will now be described in more detail with reference to FIG. 1.

As illustrated in FIG. 1, in the display device according to the present embodiment, a buffer layer 21 is formed on the substrate 10. A buffer layer 21 may serve as a barrier layer and/or a blocking layer for preventing diffusion of impurity ions and penetration of moisture or external air and planarizing an upper surface of the substrate 10.

A semiconductor layer A of a thin film transistor TFT is formed on the buffer layer 21. The semiconductor layer A may be formed of polysilicon and may include a channel region undoped with impurities and a source region and a drain region which are doped with impurities and are respectively formed both sides of the channel region. The impurities may vary depending on the type of thin film transistor, and may be N-type impurities or P-type impurities.

The semiconductor layer A may be formed of a semiconductor including amorphous silicon or crystal silicon, and may be deposited using any of various deposition methods. The crystal silicon may be formed by crystallizing amorphous silicon. Amorphous silicon may be crystallized using any of various methods, such as rapid thermal annealing (RTA), solid phase crystallization (SPC), excimer laser annealing (ELA), metal induced crystallization (MIC), metal induced lateral crystallization (MILC), and sequential lateral solidification (SLS). The semiconductor layer A may be patterned by photolithography.

A gate insulating layer 23 is deposited on the entire surface of the substrate 10 such that its covers the semiconductor layer A. The gate insulating layer 23 may be formed of an inorganic material, such as silicon oxide or silicon nitride, and have a multilayer structure or single-layer structure. In some embodiments, the gate insulating layer 23 may be formed of silicon nitride (SiNx), silicon oxide ($SiO_2$), hafnium (Hf) oxide, or aluminum oxide. The gate insulating layer 23 may be formed using any of various deposition methods, such as Chemical Vapour Deposition (CVD) and Plasma Enhanced Chemical Vapour Deposition (PECVD). The gate insulating layer 23 insulates the semiconductor layer A from a gate electrode G.

The gate electrode G may be formed of at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tungsten (W), and copper (Cu).

An interlayer insulating layer 25 is deposited on the entire surface of the substrate 10 such that its covers the gate electrode G.

The interlayer insulating layer 25 may be formed of an inorganic material or an organic material. In some embodiments, the interlayer insulating layer 25 may be formed of an inorganic material. For example, the interlayer insulating layer 25 may be formed of metal oxide or metal nitride. In detail, the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), or the like. The interlayer insulating layer 25 may be formed of an inorganic material, such as silicon oxide (SiOx) and/or silicon nitride ($SiN_x$), in a multi-layered or single-layered structure. In some embodiments, the interlayer insulating layer 25 may have a double-layer structure of SiOx/SiNy or SiNx/SiOy. The interlayer insulating layer 25 may be formed using any of various deposition methods, such as CVD and PECVD.

The interlayer insulating layer 25 may insulate the gate electrode G from wirings formed on an upper surface of the interlayer insulating layer 25.

A source electrode S and a drain electrode D of the thin film transistor TFT are formed on the interlayer insulating layer 25.

A planarization layer 27 can be formed on substantially the entire surface of the substrate 10 such that its covers the source electrode S and the drain electrode D. A pixel electrode 281 may be formed on the planarization layer 27. The pixel electrode 281 is connected to the drain electrode D of the thin film transistor TFT through a via hole.

The planarization layer 27 can be formed of an insulating material. For example, the planarization layer 27 can be formed of an inorganic material, an organic material, or an organic/inorganic compound in a single-layer or multilayer structure, and may be formed using any of various deposition methods. In some embodiments, the planarization layer 27 may be formed of at least one selected from the group consisting of polyacrylates resin, epoxy resin, phenolic resin, polyamides resin, polyimides resin, unsaturated polyesters resin, poly phenylenethers resin, poly phenylenesulfides resin, and benzocyclobutene (BCB).

An organic light-emitting diode (OLED) may be formed on the thin film transistor TFT. The OLED includes the pixel electrode 281, an intermediate layer 283 including an organic emission layer, and an opposite electrode 285. The display device according to the present embodiment may further include a pixel defining layer 29 and a spacer (not shown).

The pixel electrode 281 may be electrically connected to the drain electrode D of the thin film transistor TFT by filling the via hole of the planarization layer 27. The pixel electrode 281 and/or the opposite electrode 285 may be transparent electrodes or reflective electrodes. When the pixel electrode 281 and/or the opposite electrode 285 are transparent electrodes, the pixel electrode 281 and/or the opposite electrode 285 may be formed of a material selected from the group consisting of indium tin oxide (ITO), indium zinc oxide (IZO), zinc oxide (ZnO), and indium oxide ($In_2O_3$). When the pixel electrode 281 and/or the opposite electrode 285 are reflective electrodes, the pixel electrode 281 and/or the opposite electrode 285 may include a reflective layer that is formed of a material selected from the group consisting of silver (Ag), magnesium (Mg), aluminum (Al), platinum (Pt), palladium (Pd), gold (Au), nickel (Ni), neodymium (Nd), iridium (Ir), chromium (Cr), and a combination thereof, and a transparent layer that is formed of a material selected from the group consisting of ITO, IZO, ZnO, and $In_2O_3$. In some embodiments, the pixel electrode 281 or the opposite electrode 285 may have an ITO/Ag/ITO structure.

The pixel defining layer 29 may define a pixel region and a non-pixel region. The pixel defining layer 29 includes an aperture via which the pixel electrode 281 is exposed, and may be formed to cover the entire surface of the substrate 10. The intermediate layer 283, which will be described later, may be formed in the aperture, and thus the aperture may serve as a substantial pixel region.

The pixel electrode 281, the intermediate layer 283, and the opposite electrode 285 constitute the OLED. Holes and electrons injected into the pixel electrode 281 and the opposite electrode 285 of the OLED may combine with each other in the organic emission layer of the intermediate layer 283 to thereby generate light.

The intermediate layer 283 may include an organic emission layer. As another example, the intermediate layer 283 includes an organic emission layer. However, the intermediate layer 283 may further include at least one selected from a hole injection layer (HIL), a hole transport layer (HTL), an electron transport layer (ETL), and an electron injection layer (EIL). The present embodiment is not limited thereto, and the intermediate layer 283 may further include the other functional layers in addition to an organic emission layer.

The HIL may be formed of a phthalocyanine compound such as copper phthalocyanine, or TCTA, m-MTDATA, or m-MTDAPB which is a star-bust type amine The HTL may be formed of N,N'-bis(3-methylphenyl)-N,N'-diphenyl-[1,1-biphenyl]-4,4'-diamine (TPD), N,N'di(naphthalene-1-yl)-N,N'-diphenyl benzidine (α-NPD), and the like.

The EIL may be formed of a material such as LiF, NaCl, CsF, Li$_2$O, BaO, or Liq.

The ETL may be formed of Alg$_3$.

The organic emission layer may include a host material and a dopant material. Examples of the host material of the organic emission layer may include tris 8-hydroxy-quinolinato)aluminum (Alq3, 9,10-di(naphth-2-yl)anthracene (AND), 3-tert-butyl-9,10-di(naphth-2-yl)anthracene (TBADN), 4,4'-bis 2,2-diphenyl-ethene-1-yl)-4,4'-dimethylphenyl (DPVBi), 4,4'-bis 2,2-diphenyl-ethene-1-yl)-4,4'-dimethylphenyl (p-DMDPVBi), tert 9,9-diarylfluorene)s (TDAF), 2-9,9'-spirobifluorene-2-yl)-9,9'-spirobifluorene (BSDF), 2,7-bis 9,9'-spirobifluorene-2-yl)-9,9'-spirobifluorene (TSDF), bis 9,9-diarylfluorene)s (BDAF), 4,4'-bis 2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4''-tris(carbazol-9-yl)triphenylamine (TcTa), 4,4'-bis(carbazol-9-yl)biphenyl (CBP), 4,4'-bis 9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis 9-phenyl-9H-carbazol)fluorene (FL-4CBP), 4,4'-bis(carbazol-9-yl)-9,9-di-tolyl-fluorene (DPFL-CBP), 9,9-bis 9-phenyl-9H-carbazol)fluorine (FL-2CBP), and the like.

Examples of the dopant material of the organic emission layer may include 4,4'-bis[4-(di-p-tolylamino)styryl]biphenyl (DPAVBi), 9,10-di(naph-2-tyl)anthracene (ADN), 3-tert-butyl-9,10-di(naph-2-tyl)anthracene (TBADN), and the like.

The opposite electrode 285 is formed on the intermediate layer 283. The opposite electrode 285 forms an electric field together with the pixel electrode 281 so that light is emitted by the intermediate layer 283. The pixel electrode 281 may be patterned in each pixel, and the opposite electrode 285 may be formed so that a common voltage is applied to all of the pixels.

The pixel electrode 281 and the opposite electrode 285 may be formed as transparent electrodes or as reflective electrodes. The pixel electrode 281 may function as an anode and the opposite electrode 285 may function as a cathode, but the present invention is not limited thereto. For example, the pixel electrode 281 may function as a cathode, and the opposite electrode 285 may function as an anode.

Although only one OLED is illustrated in FIG. 2, a display panel may include a plurality of OLEDs. One pixel may be formed in each OLED. Each of the pixels may emit light of a red color, a green color, a blue color, or a white color.

However, the present invention is not limited thereto. The intermediate layer 283 may be commonly formed on the entire surface of the pixel electrode 281 regardless of locations of the pixels. In this case, the organic emission layer may be formed by stacking a light-emitting substance emitting a red light, a light-emitting substance emitting a green light, and a light-emitting substance emitting a blue light on one another or by mixing a light-emitting substance emitting a red light, a light-emitting substance emitting a green light, and a light-emitting substance emitting a blue light. Any combination of other various colors, which is capable of emitting a white light, may be employed in addition to a combination of red, green, and blue colors. The display device may further include a color converting layer or a color filter that coverts the white light into a light of a predetermined color.

A protection layer (not shown) may be formed on the opposite electrode 285 and may cover and protect the OLED. An inorganic insulation layer and/or an organic insulation layer may be used as the protection layer.

The spacer (not shown) may be formed between pixel regions in a display region, The spacer may maintain an interval between the substrate 10 and the encapsulation substrate 50 and prevent degradation of the display characteristics by external impacts.

The spacer may be formed on the pixel defining layer 29. The spacer may protrude from the pixel defining layer 29 toward the encapsulation substrate 50.

In some embodiments, the spacer may include the same material as the pixel defining layer 29 and may be formed by using the same process as the process for forming the pixel defining layer 29. In other words, the pixel defining layer 29 and the spacer may be substantially simultaneously or concurrently formed by adjusting the amount of exposure by using a halftone mask during an exposure process. However, the present invention is not limited thereto. The pixel defining layer 29 and the spacer may be sequentially or independently formed, and may be independent structures formed of different materials.

As illustrated in FIG. 2, the display device according to the present embodiment may be divided into a light-emitting region A, in which the display unit 20 emits light, and an outer region B, which is a remaining region of the display device.

The light-emitting region A may include the above-described display unit 20 as illustrated in FIG. 2. The thin film encapsulation or thin film encapsulation layer 30 may be formed on the substrate 10 such that it covers the display unit 20.

Figure 3:
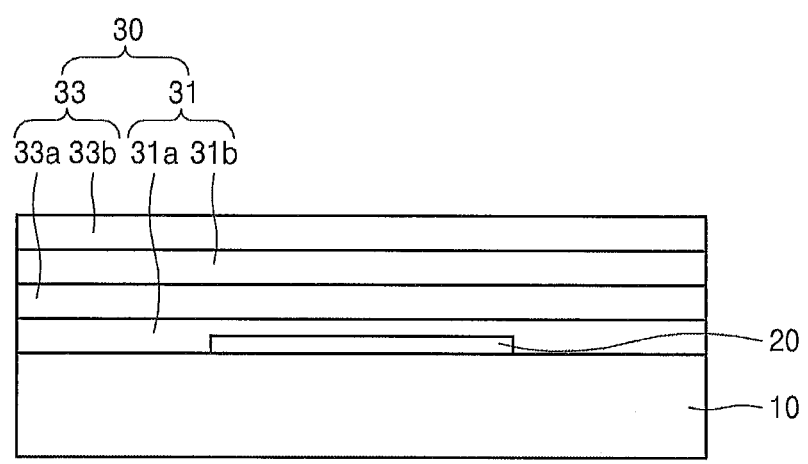
FIG. 3 is a cross-sectional view illustrating a thin film encapsulation structure or layer according to an embodiment.

FIG. 3 is a cross-sectional view illustrating the thin film encapsulation layer 30 in more detail, according to an embodiment.

As illustrated in FIG. 3, the thin film encapsulation 30 may be formed on the substrate 10 such that it covers the display unit 20. The thin film encapsulation 30 may have a structure in which a plurality of thin film layers are stacked. Thus, the thin film encapsulation 30 may have a structure in which an organic layer 31 and an inorganic layer 33 are alternately stacked.

Although a first organic layer 31a, a first inorganic layer 33a, a second organic layer 31b, and a second inorganic layer 33b are sequentially stacked on the display unit 20 in FIG. 3, the number of thin film layers that are stacked is not limited thereto.

The inorganic layer 33 may firmly block the penetration of oxygen or moisture, and the organic layer 31 may absorb stress generated by the inorganic layer 33 so that the thin film encapsulation may be flexible.

The inorganic layer 33 may be a single layer or a layer stack including metal oxide or metal nitride. For example, the first and second inorganic layers 33a and 33b may include $SiN_x$, $Al_2O_3$, $SiO_2$, or $TiO_2$.

The organic layer 31 may include a polymer and may be a single layer or a layer stack including polyethylene terephthalate, polyimide, polycarbonate, epoxy, polyethylene, or polyacrylate. For example, the first and second organic layers 31a and 31b may be formed of polyacrylate. In detail, the first and second organic layers 31a and 31b may include a result of polymerizing a monomer composition including diacrylate-based monomer and triacrylatebased monomer. The monomer composition may further include monoacrylate-based monomer. The monomer composition may further include a well-known photoinitiator such as trimethyl benzoyl diphenyl phosphine oxide (TPO), but the present invention is not limited thereto.

In the display device according to the present embodiment, since the thin film encapsulation 30 is formed to have a structure in which the organic layer 31 and the inorganic layer 33 are alternately stacked, penetration of oxygen and moisture may be prevented and also flexibility may be secured, and moreover total reflection may be controlled to smoothly occur within the thin film encapsulation 30.

Since the organic layer 31 and the inorganic layer 33 are formed of materials having different refractive indices, light emitted by the display unit 20 is not discharged from the outer region B, and reflection repeatedly occurs within the thin film encapsulation 30.

In other words, a conventional display device of a top-emission type does not include a structure corresponding to the thin film encapsulation 30 according to the present embodiment, and thus light loss occurs in the outer region B. Accordingly, the amount of light transmitted to a photosensor is not sufficient and thus the photosensor cannot sense light.

Therefore, in the display device according to the present embodiment, the thin film encapsulation 30 is formed on the substrate 10 so that light emitted toward a top side of the display device may be reflected by the organic layer 31 and the inorganic layer 33 of the thin film encapsulation 30 in the outer region B and be confined within the thin film encapsulation 30.

In other words, as light is repeatedly reflected by the organic layer 31 and the inorganic layer 33, which are alternately stacked and have different refractive indices, light may not travel toward the top side and only travel toward a lateral side. Consequently, since light travels sideways, sufficient light may be transmitted to the photosensor 60 according to the present embodiment, which is formed on a lateral side of the thin film encapsulation.

Additionally, since the display device according to the present embodiment includes the thin film encapsulation 30, the thin film encapsulation 30 may further block, along with the encapsulation substrate 50, the display unit 20 from external oxygen and/or moisture.

In other words, the thin film encapsulation 30 according to the present embodiment may confine light therewithin so that the light is not emitted to the top side, and may protect the display unit 20 from the outside.

As illustrated in FIG. 2, the photosensor 60 may be included in the outer region B. For example, in the display device according to the present embodiment, the photosensor 60 is formed on one end of the thin film encapsulation 30.

In the display device according to the present embodiment, the photosensor 60 may be implemented by using a photodiode, but the present invention is not limited thereto.

The photosensor 60 senses light and converts energy of the sensed light into electrical energy. The photosensor 60 is usually used in electronic products and may be employed to accurately measure the intensity of light. Since an output voltage may be generated according to the intensity of sensed light, the photosensor 60 may measure the intensity of light.

However, when the amount of light transmitted to the photosensor 60 is not enough, it is difficult to accurately the intensity of light. Thus, to achieve accurate measurement, light that is emitted by the light-emitting device needs to substantially reach the photosensor 60.

In a conventional display device, light is reflected by an encapsulation substrate formed in opposite to a substrate, and a photosensor is attached directly to an upper surface the encapsulation substrate or a lower surface of the substrate and receives the reflected light. The encapsulation substrate does not have a total reflection control capability, and accordingly the photosensor receives weak light and thus is not expected to function as a sensor.

On the other hand, in the display device according to the present embodiment, since the thin film encapsulation 30 is included as illustrated in FIG. 2, light is reflected by the organic layer 31 and the inorganic layer 33 of the thin film encapsulation 30 and travels sideways. Since the photosensor 60 is formed on one end of the thin film encapsulation 30, a sufficient amount of light may be transmitted to the photosensor 60.

In other words, since the photosensor 60 is formed on one end of the thin film encapsulation 30, the photosensor 60 may receive a sufficient amount of light from the lateral side of the thin film encapsulation 30. Additionally, since the photosensor 60 is formed in an empty space within the outer region B, a practical use of a space may increase.

As illustrated in FIG. 2, the encapsulation substrate 50 may be formed opposite the substrate 10 in order to protect the display unit 20 included in the substrate 10 from external moisture, air, and the like.

The encapsulation substrate 50 may be formed of the same material as the substrate 10, for example, a transparent glass or plastic material.

In the display device according to the present embodiment, the thin film encapsulation 30 and the encapsulation substrate 50, which are formed on the display unit 20, may additionally prevent the display unit 20 from penetration of external moisture, air, and the like.

As illustrated in FIG. 2, to attach the encapsulation substrate 50 to the upper surface of the thin film encapsulation 30, an adhesion layer 40 may be further formed between the thin film encapsulation 30 and the encapsulation substrate 50.

The adhesion layer 40 may be located between respective ends of the thin film encapsulation 30 and the encapsulation substrate 50 as illustrated in FIG. 2 and seal the thin film encapsulation 30 and the encapsulation substrate 50.

The adhesion layer 40 may include an organic material, such as epoxy, acryl, or silicon, including a light curing material, or an organic and inorganic material in which talc, Ca oxide (CaO), barium oxide (BaO), zeolite, SiO, or the like is included in an organic material. The adhesion layer 40 may be in a hardened state due to light such as ultraviolet (UV) rays.

In other words, the adhesion layer 40 may be formed of an adhesive organic, an inorganic material, and a transparent material. The adhesion layer 40 may block the space between the thin film encapsulation 30 and the encapsulation substrate 50 from external moisture or air.

Figure 4:
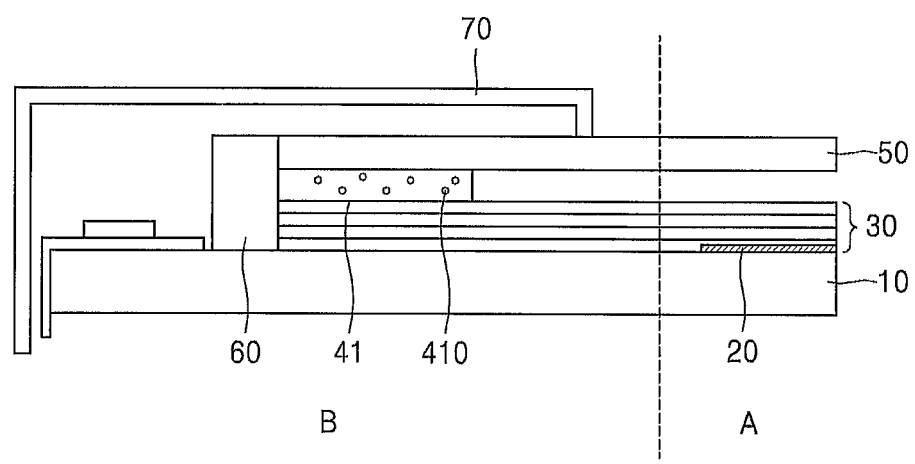
FIG. 4 is a cross-sectional view illustrating a display device according to another embodiment.

FIG. 4 is a cross-sectional view of a display device according to another embodiment. The same reference numerals in FIGS. 1-3 and FIG. 4 denote the same elements and repeated descriptions thereof are omitted.

In the display device according to the present embodiment, to attach the encapsulation substrate 50 to the thin film encapsulation 30, an adhesion layer 41 that reflects light may be further formed between the thin film encapsulation 30 and the encapsulation substrate 50.

In the display device according to the present embodiment, the adhesion layer 41 may include metal particles 410.

The metal particles 410 may be metal, such as Al or Ag having high reflectance. As the adhesion layer 41 includes the metal particles 410 having high reflectance, light loss may be reduced.

For example, when the light emitted by the display unit 20 is totally reflected by the thin film encapsulation 30 and reaches the adhesion layer 41 while travelling sideways, the metal particles 410 included in the adhesion layer 41 may prevent light from passing therethrough.

When the metal particles 410, such as Al or Ag having high reflectance, are included in the adhesion layer 41, light that reaches the adhesion layer 41 may be reflected by the metal particles 410 back to the thin film encapsulation 30.

Thus, in the display device according to the present embodiment, emission of light to the environment via the transparent adhesion layer 41, for example, light loss, may be prevented.

Figure 5:
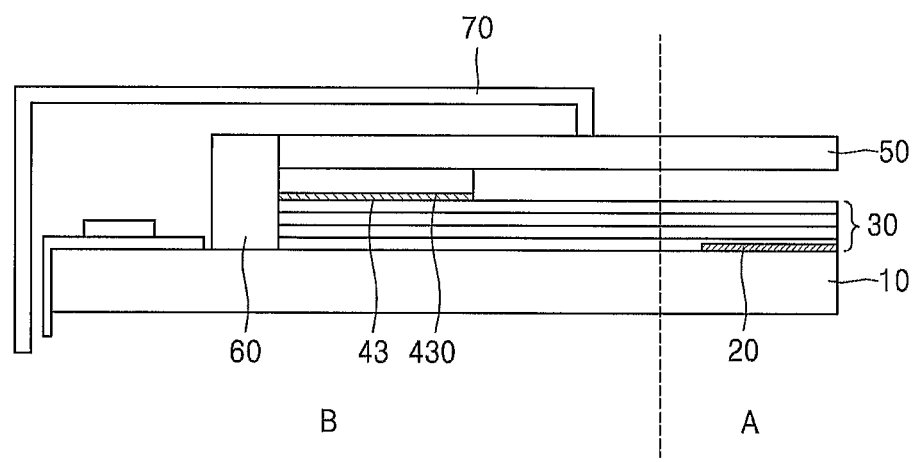
FIG. 5 is a cross-sectional view illustrating a display device according to another embodiment.

FIG. 5 is a cross-sectional view of a display device according to another embodiment. The same reference numerals in FIGS. 1-3 and FIG. 5 denote the same elements and repeated descriptions thereof are omitted.

In the display device according to the present embodiment, to attach the encapsulation substrate 50 to the thin film encapsulation 30, an adhesion layer 43 may be further formed between the thin film encapsulation 30 and the encapsulation substrate 50, and a reflection layer 430 may be formed on an upper surface of the adhesion layer 43.

The reflection layer 430 may be in the form of a thin film formed on the upper surface of the adhesion layer 43 and my reflect light that travels toward the adhesion layer 43.

For example, when the light emitted by the display unit 20 is totally reflected by the thin film encapsulation 30 and reaches the adhesion layer 43 while travelling sideways, the light may travel toward the top side, and thus, light loss may occur. To prevent this light loss, the reflection layer 430 may be formed on the upper surface of the adhesion layer 43.

FIGS. 4 and 5 illustrate the adhesion layers 41 and 43 that are capable of reflecting light incident thereon in order to prevent light loss. However, the present invention is not limited thereto, and any adhesion layer may be included as long as the adhesion layer is formed of a material capable of reflecting light or has a structure capable of reflecting light.

Referring back to FIG. 2, a cover 70 may be included in the outer region B to surround the display device according to the present embodiment.

The cover 70 corresponds to a frame of a TV, a bezel of a mobile phone, or the like. The cover 70 may be formed to surround the display device in order to prevent users from seeing internal wiring, circuits, and other unnecessary structures.

Moreover, since the cover 70 surrounds the display device, the display device may be provided in a rigid and strong state.

As described above, according to at least one of the disclosed embodiments, in a top-emission type display device, light loss is prevented, and a sufficient amount of light is transmitted to a photosensor.

It should be understood that the exemplary embodiments described therein should be considered in a descriptive sense only and not for purposes of limitation. Descriptions of features or aspects within each embodiment should typically be considered as available for other similar features or aspects in other embodiments.

While the inventive technology has been particularly shown and described with reference to exemplary embodiments thereof, it will be understood by those of ordinary skill in the art that various changes in form and details may be made therein without departing from the spirit and scope of the following claims.

What is claimed is:

1. A display device comprising:
a substrate;
a display unit formed over the substrate and configured to output light;
a thin film encapsulation layer covering the display unit;
an encapsulation substrate formed over the thin film encapsulation layer and covering an upper surface of the display unit; and
a photosensor directly contacting a lateral surface of the thin film encapsulation layer and configured to sense part of the light output from the display unit,
wherein the thin film encapsulation layer comprises a first inorganic layer, an organic layer on the first inorganic layer, and a second inorganic layer on the organic layer, and
wherein the first inorganic layer, the organic layer and the second inorganic layer are configured to cause a total reflection of light to repeatedly occur within the thin film encapsulation layer such that the reflected light travels sideways.

2. The display device of claim 1, wherein the organic layerslayer and the inorganic layers have different refractive indices from each other.

3. The display device of claim 1, further comprising an adhesion layer formed between the thin film encapsulation layer and the encapsulation substrate, wherein the adhesion layer attaches the thin film encapsulation layer to the encapsulation substrate.

4. The display device of claim 3, wherein the adhesion layer is formed of a transparent organic material.

5. The display device of claim 3, wherein the adhesion layer comprises a plurality of metal particles.

6. The display device of claim 3, further comprising a reflection layer formed over an upper surface of the adhesion layer.

7. The display device of claim 3, wherein the thickness of the photosensor is the same as the combined thickness of the thin film encapsulation layer, the adhesion layer and the encapsulation substrate.

8. The display device of claim 3, wherein the photosensor directly contacts lateral surfaces of the adhesion layer and the encapsulation substrate.

9. A display device comprising:
a substrate including a light-emitting region and an outer region;
an encapsulation substrate formed opposite to the substrate;
a display unit formed in the light-emitting region of the substrate and configured to output light;
a thin film encapsulation layer covering the display unit; and
a photosensor formed in the outer region of the substrate and directly contacting a lateral surface of the thin film encapsulation layer, wherein the photosensor is configured to sense part of the light output from the display unit,
wherein the thin film encapsulation layer comprises a first inorganic layer, an organic layer on the first inorganic layer, and a second inorganic layer on the organic layer, and
wherein the first inorganic layer, the organic layer and the second inorganic layer are configured to cause a total reflection of light to repeatedly occur within the thin film encapsulation layer such that the reflected light travels sideways.

10. The display device of claim 9, wherein the organic layers layer and the inorganic layers have different refractive indices from each other.

11. The display device of claim 9, further comprising an adhesion layer formed between the thin film encapsulation layer and the encapsulation substrate, wherein the adhesion layer attaches the thin film encapsulation layer to the encapsulation substrate.

12. The display device of claim 11, wherein the thickness of the photosensor is the same as the combined thickness of the thin film encapsulation layer, the adhesion layer and the encapsulation substrate.

13. The display device of claim 11, wherein the photosensor directly contacts lateral surfaces of the adhesion layer and the encapsulation substrate.

* * * * *